(12) United States Patent
Boivin (10) Patent No.: US 8,999,796 B2
(45) Date of Patent: Apr. 7, 2015

(54) MANUFACTURING PROCESS OF MEMORY CELLS

(71) Applicant: STMicroelectronics (Rousset) SAS, Rousset (FR)

(72) Inventor: Philippe Boivin, Venelles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/074,059

(22) Filed: Nov. 7, 2013

(65) Prior Publication Data

US 2014/0127873 A1 May 8, 2014

(30) Foreign Application Priority Data

Nov. 8, 2012 (FR) ................................ 1260574

(51) Int. Cl.
| | | |
|---|---|---|
| H01L 27/115 | (2006.01) | |
| H01L 29/66 | (2006.01) | |
| H01L 27/112 | (2006.01) | |
| H01L 27/105 | (2006.01) | |
| H01L 21/28 | (2006.01) | |
| H01L 29/423 | (2006.01) | |
| H01L 29/788 | (2006.01) | |
| H01L 29/792 | (2006.01) | |
| H01L 21/283 | (2006.01) | |
| H01L 21/768 | (2006.01) | |

(52) U.S. Cl.
CPC .... *H01L 29/66833* (2013.01); *H01L 27/11563* (2013.01); *H01L 21/283* (2013.01); *H01L 27/11206* (2013.01); *H01L 27/1052* (2013.01); *H01L 21/768* (2013.01); *H01L 21/28273* (2013.01); *H01L 21/28282* (2013.01); *H01L 29/42328* (2013.01); *H01L 29/42344* (2013.01); *H01L 29/66825* (2013.01); *H01L 29/7881* (2013.01); *H01L 29/792* (2013.01); *H01L 27/11521* (2013.01); *H01L 27/11524* (2013.01); *H01L 27/11568* (2013.01); *H01L 27/1157* (2013.01)

(58) Field of Classification Search
CPC ................ H01L 27/07; H01L 27/1128; H01L 27/11563

See application file for complete search history.

(56) References Cited

U.S. PATENT DOCUMENTS

2010/0230744 A1  9/2010  Phua et al.
2012/0135596 A1  5/2012  Kang et al.

*Primary Examiner* — Cheung Lee
(74) *Attorney, Agent, or Firm* — Allen, Dyer, Doppelt, Milbrath & Gilchrist, P.A.

(57) ABSTRACT

A method for fabricating at least one cell of a semiconducting component includes positioning a first conducting polysilicon-type layer on a substrate, above an insulating oxide-type layer. The production of at least one trench within the first conducting layer is included to form two electrically unlinked distinct conducting parts intended to form two transistor gates of respectively two distinct twin cells.

9 Claims, 9 Drawing Sheets

MANUFACTURING PROCESS OF MEMORY CELLS

FIELD OF THE INVENTION

The present document relates to an electrically programmable memory cell for a semiconductor component, and to a component including several memory cells, such as an electrically programmable memory, for example, and also pertains to a method for fabricating such a memory cell and such an electrically programmable memory.

BACKGROUND OF THE INVENTION

Figure 1:
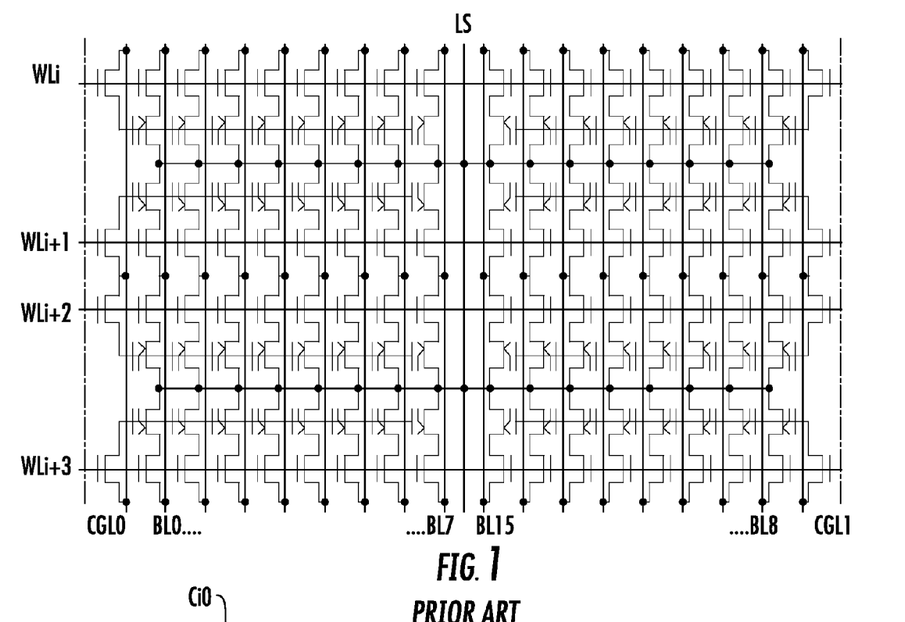
FIG. 1 is a schematic diagram illustrating the structure of an electrically programmable memory part according to a prior art.
Figure 2:
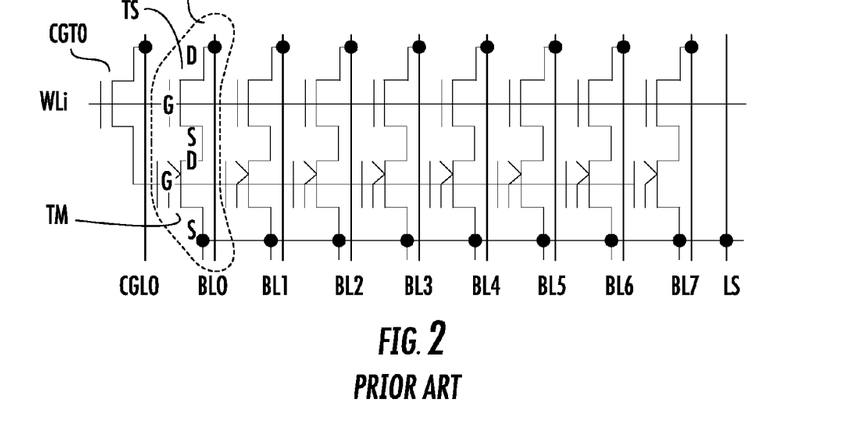
FIG. 2 is a schematic diagram illustrating an octet of the electrically programmable memory of FIG. 1 according to the prior art.

According to a typical architecture of the prior art, an electrically erasable and programmable memory of the EEPROM or FLASH type, a part of which is schematically represented in FIGS. 1 and 2 for example, includes memory cells Cij organized in a memory plane according to a matrix of n×m cells disposed in n rows (or lines) and m columns, each being situated at the intersection of a word line and of a bit line. In such a memory, each cell Cij, more particularly visible in FIG. 2, can contain an item of information. Accordingly, each cell comprises a storage transistor TM which comprises a specific zone designed to trap or free an electric charge, representative of the binary item of information, which can be modified electrically via electrodes of the cell during, for example, a write operation or an erase operation. Such a cell Cij moreover comprises a second transistor, called an access or selection transistor TS, which participates in the memory cell control operations.

More precisely, the EEPROM memory part represented by FIG. 1, for example, comprises two columns and four rows, with which are associated four word lines of 8 bits $WL_i$ to $WL_{i+3}$. In each of these rows, the memory part in fact comprises eight bit lines (respectively BL0 to BL7 and BL8 to BL15) linked to eight memory cells. In this example represented, these eight cells disposed at each intersection of a column and of a row thus form a memory octet or word.

FIG. 2 more precisely represents such a memory octet. Each memory cell of this octet, such as the highlighted cell $C_{10}$, comprises a storage transistor TM and a selection transistor TS as discussed above. The selection transistor has its gate G connected to the word line $WL_i$, its drain D connected to a bit line $BL_0$ and its source S connected to the drain D of the storage transistor TM. This storage transistor has its common source LS connected to a source line LS and its control gate G connected to a gate control line $CGL_0$. It is therefore noted that each memory cell Cij therefore comprises four electrodes linked to the remainder of the memory architecture.

The production of a semiconducting component such as a non-volatile memory as described hereinabove requires the fabrication of the various cells, considered individually, as simply as possible. Thereafter, it is also necessary to allow the production of the electrical connections of the four electrodes of each cell so as to form an electrical component comprising several cells, as in the case of the EEPROM memory. In onboard memories fabricated by a method of the CMOS type, making it possible to integrate these memories into integrated circuits, the natural method of fabrication rests upon various conventional steps, including a special isotropic etching making it possible to remove a part of the polycrystalline silicon spacers used.

Figure 3:
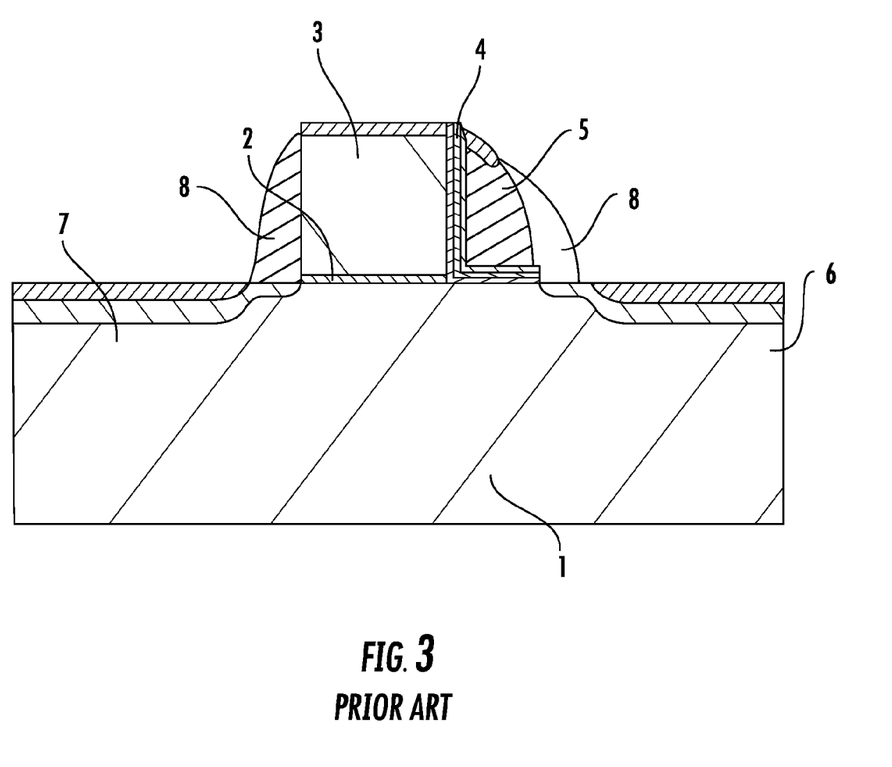
FIG. 3 is a schematic diagram illustrating a sectional view of a memory cell according to a prior art.

A cell of the prior art, represented in FIG. 3, comprises a first selection transistor accessible through notably a selection gate 3 formed by a polysilicon film. This selection gate 3 is separated from the substrate 1, of silicon wafer type, by a dielectric insulating layer 2, an oxide film. The cell moreover comprises a storage transistor, comprising a charge trapping zone 4. This charge trapping zone 4 is disposed in part laterally, between the selection gate 3 and a control gate 5. It is also separated from these two gates by insulating zones. Finally, the cell comprises laterally a source zone 6 and a drain zone 7. Lateral spacers 8 laterally cover the central zone overlaid on the substrate and disposed between the source and drain zones.

Figure 4:
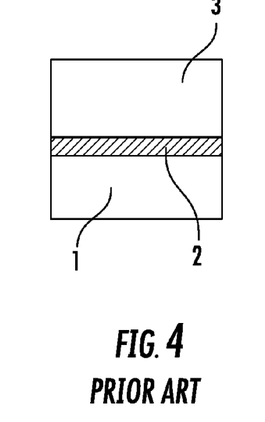
FIGS. 4 to 12 are cross-sectional views illustrating the memory cell according to the prior art represented in FIG. 3 according to various steps of a fabrication method.
Figure 5:
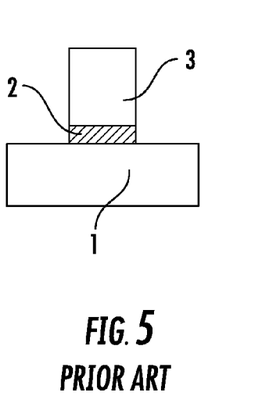
Figure 6:
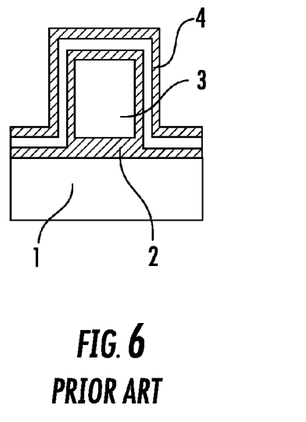
Figure 7:
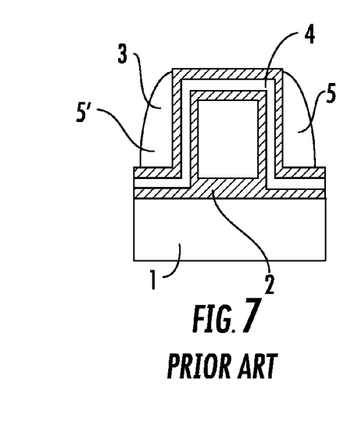

FIGS. 4 to 12 schematically illustrate cross-sectional views of a cell according to several steps of a method for fabricating such a cell. FIG. 4 represents a method starting situation in which a first dielectric material layer 2 has been disposed on a substrate 1, and then a second polysilicon layer 3. FIG. 5 represents the result obtained after a step of lateral etching of the structure of FIG. 4. Thereafter, a layer 4 is disposed on the upper contour of the whole of this structure, to achieve the result represented in FIG. 6. This layer 4 can take the form of an assembly of layers allowing the trapping of electric charges. Thereafter, a polysilicon deposition, followed by an etching step, makes it possible to produce spacer type zones 5, 5' on the two flanks of the previously produced gate, to obtain the result of FIG. 7. The right zone or spacer in this FIG. 7 is intended to form the control gate 5 of the memory cell.

Figure 8:
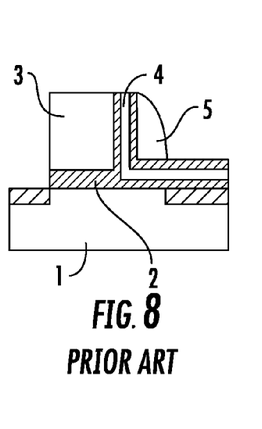
Figure 9:
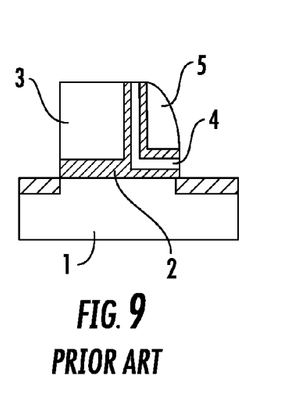

The method then comprises an additional step which includes removing the zone 5' formed on the left of FIG. 7, symmetrically with the right part of the structure, as well as the dielectric layer 4 on this left part above the substrate 1, to obtain the result of FIG. 8. Accordingly, a photomasking step makes it possible to etch in an isotropic manner the zone 5' to be eliminated. As a supplement, the dielectric layer 4 which rests horizontally on the substrate 1 and which overhangs the control gate 5 is likewise discarded, to allow the future silicidation of the gates and active zones. Finally, the result obtained is represented in FIG. 9.

Figure 10:
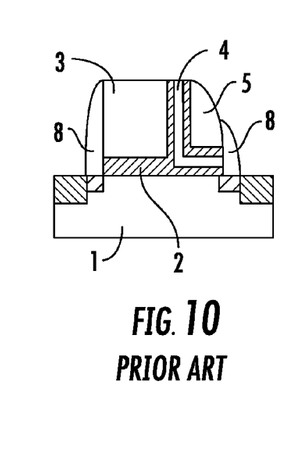
Figure 11:
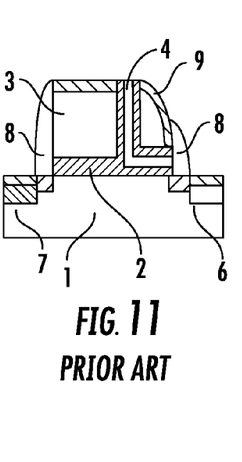
Figure 12:
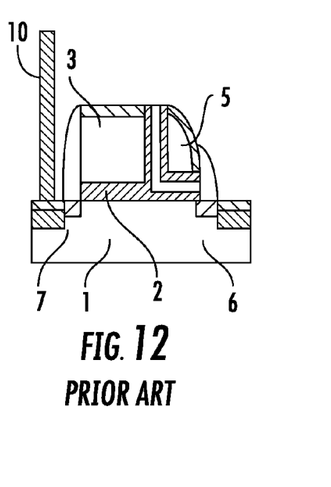

Thereafter, lateral spacers 8 are formed, according to a conventional procedure employing CMOS technology, to obtain the result represented by FIG. 10, and then the upper surface of this assembly is treated to form silicide conducting layers 9 at the level of the future electrodes of the memory cell, as represented in FIG. 11, and on which are finally added contacts 10, to achieve the final form of the structure represented by FIG. 12. Note, this method also includes the formation of the source 6 and drain 7 zones by various known doping processes, not described here.

The result obtained represented by FIG. 12 therefore includes a cell comprising two transistors and four electrodes 10 respectively linked to the source zone 6, drain zone 7, selection gate zone 3 and control gate zone 5. This method of fabrication exhibits the drawback of being complex, difficult to integrate into CMOS logic, without adding numerous steps, and of making it difficult to produce the electrical links between the electrodes of the various cells in a semiconducting component of the non-volatile memory type.

Thus, there exists a need to improve the structure of such semiconducting components, notably to simplify their method of fabrication so as to reduce their cost, while achieving reliable, efficacious, and compact components.

SUMMARY OF THE INVENTION

For this purpose, the present embodiments provide a method for fabricating at least one cell of a semiconducting component comprising a step of positioning a first conducting layer of polysilicon type on a substrate, above an insulating oxide type layer, and also including a step comprising the production of at least one trench within the first conducting layer so as to form two electrically unlinked distinct conducting parts intended to form two transistor gates of respectively two distinct twin cells. The trench can separate the first conducting layer into two conducting parts distributed symmetrically around the trench, whose width represents sufficient space for the positioning of an electrical contact.

The method can comprise a step of depositing a layer comprising a material for trapping charge above the conducting layer before the production of the trench. The method can comprise a step of adding a second conducting layer of polysilicon type above the layer comprising a material for trapping charge, and then an etching step so as to obtain lateral conducting parts in the manner of spacers. The method can comprise a step of forming spacers on either side of the vertical lateral walls of the two structures, left and right, formed around the central trench.

The method can comprise a step of depositing silicide and/or electrodes, at the level of a conducting part obtained by the depositing of the first conducting layer and at the level of a lateral conducting part obtained by the depositing of the second conducting layer, and on either side of these conducting parts at the level of source and drain zones. The method for fabricating at least one cell can form two twin cells sharing a common source or drain electrode in the central part between its two twin cells.

The embodiments also pertain to a method for fabricating a semiconducting component of the electrically programmable non-volatile memory type, including the production of several memory cells by a fabrication method such as described above. The method for fabricating a semiconducting component can comprise a step of depositing a first conducting layer on a substrate, above an insulating layer, this conducting layer exhibiting a U shape defining a notch oriented in a longitudinal direction to form a first zone for managing the memory cells and a second zone for the formation of the memory cells, the substrate integrating isolation zones oriented in a transverse direction so as to electrically insulate the future memory cells.

The method for fabricating a semi-conducting component may include the following additional steps: deposition of a layer comprising a material for trapping charge on the previously formed structure; deposition of a second conducting layer above this layer comprising a material for trapping charge; production of one or more central trenches; etching of the second conducting layer at the level of the second zone so as to form lateral conducting parts in the form of spacers separated from the first conducting layer by a substantially vertical insulating part of the layer comprising a material for trapping charge; the lateral conducting parts remaining in contact with the second conducting layer at the level of the first zone so as to form at least one gate control electrode of the memory cells of the second zone; and the first conducting layer remaining accessible at the level of the first zone so as to form at least one electrode for selecting the memory cells of the second zone.

The method for fabricating a component such as described hereinabove can be applied so as to fabricate an electrically programmable non-volatile memory of the EEPROM type.

BRIEF DESCRIPTION OF THE DRAWINGS

These objects, characteristics and advantages of the present embodiments will be set forth in detail in the following description of a particular non-limiting mode provided in conjunction with the attached figures among which:

FIGS. 22a to 26a and 22b to 26b are respective cross-sectional views according to transverse planes A-A' and B-B' of the electrically programmable memory part including memory cells according to one embodiment of the invention during various steps of a fabrication method according to one embodiment of the invention.

DETAILED DESCRIPTION OF THE PREFERRED EMBODIMENTS

Figures 13, 14:
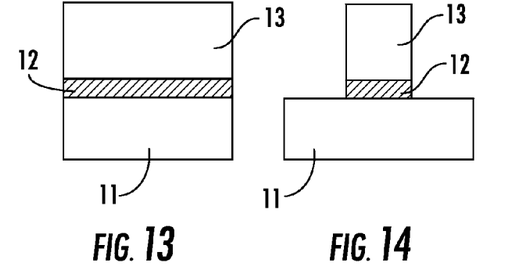
FIGS. 13 to 20 are cross-sectional views of a memory cell according to one embodiment of the invention for various steps of a fabrication method according to one embodiment of the invention.
Figure 15:
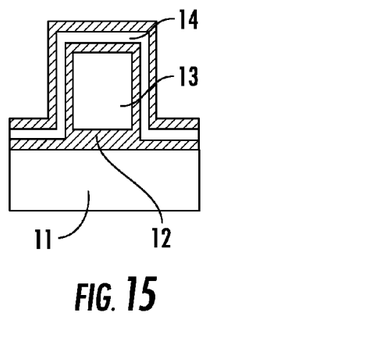

FIGS. 13 to 20 therefore schematically represent various steps of a method for fabricating a memory cell according to one embodiment. FIGS. 13 to 15 represent steps similar to those illustrated by FIGS. 4 to 6 of the approach of the prior art. These steps make it possible to obtain the structure represented by FIG. 15, on which a polysilicon conducting layer 13 is deposited on a substrate 11, and etched to form a central islet of rectangular section. It is separated from the substrate 11 by a first insulating layer 12, for example of the dielectric type. The assembly is covered with a layer 14 comprising a material serving to trap charges, surrounded by an insulating material.

Figures 16, 17:
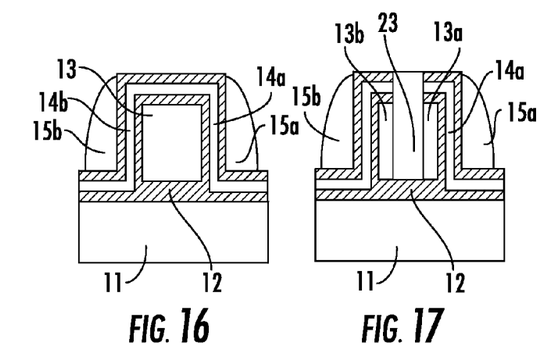

FIG. 16 includes the addition of a second polysilicon conducting layer above the previously obtained structure, and then of an etching step so as to obtain conducting parts 15a, 15b in the manner of spacers, respectively disposed to the right and to the left of the central islet, separated from the first conducting layer 13 by substantially vertical walls 14a, 14b of the previously formed layer of the material for trapping charge.

FIG. 17 represents a step according to a particular approach of the mode of production, which includes a step of etching a trench 23 in the central part of the central islet. This trench 23 exhibits a substantially rectangular section, which exhibits a width necessary for installing a source contact common to two cells, as will be illustrated subsequently. Moreover, this trench 23 exhibits a depth down to as far as the insulating layer 12 directly on the surface of the substrate 11, sufficient to insulate the two structures made of conducting material (polysilicon). The result obtained is a structure symmetrically distributed around this trench 23, comprising, above the substrate 11 and its dielectric insulating layer 12, polysilicon zones 13a, 13b respectively on the right and on the left, and covered with a layer 14a, 14b comprising a material for trapping charge.

Figure 18:
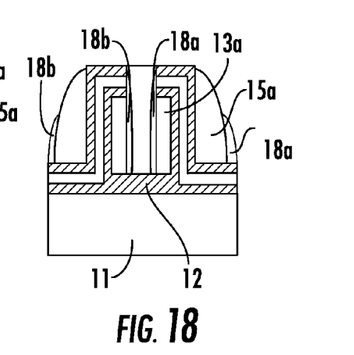
Figure 19:
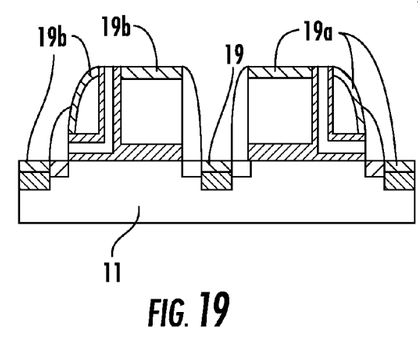

Thereafter, FIG. 18 represents the result obtained by the formation of spacers 18a, 18b on either side of the vertical lateral walls of respectively the two structures, left and right, around the central trench 23. These spacers 18a, 18b protect in a conventional manner the structure obtained previously for the implementation of steps of implanting and doping the substrate 11 so as to form future drain and source zones. Thereafter, a salicide step makes it possible to produce silicide zones 19a, 19b at the level of future electrodes of the cells, as is represented by FIG. 19. These electrodes 20 are thereafter added, to obtain the final result of FIG. 20.

In parallel with the steps of the above-described method, steps of implantation and doping are implemented in a known manner to form source 16 and drain 17a, 17b zones, the spacers 18a, 18b protecting the structure during these implantations and doping in the substrate 11. The result obtained therefore takes the form of two twin cells, sharing a common central electrode.

This approach can be utilized for the production of a semiconducting component comprising any transistor with a dual conducting gate, notably a polysilicon dual structure. Notably, this approach is advantageous for any electrically programmable non-volatile memory such as a memory of the EEPROM type, with architecture such as represented by FIGS. 1 and 2.

Figure 21:
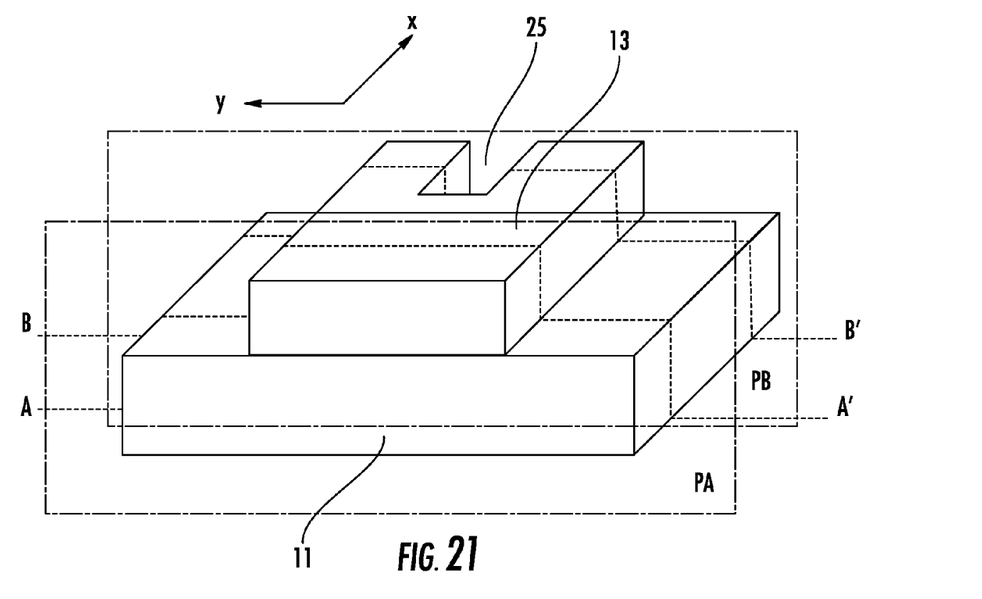
FIG. 21 is a perspective view of an electrically programmable memory part including memory cells according to one embodiment of the invention during a step of a fabrication method according to one embodiment of the invention.
Figure 21A:
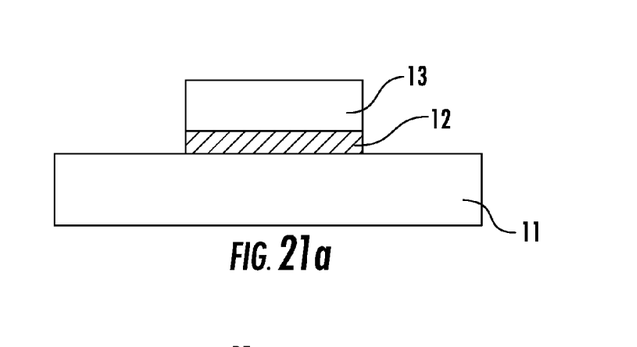
FIGS. 21a and 21b are cross-sectional views respectively according to transverse planes A-A and B-B of the electrically programmable memory part including memory cells according to one embodiment of the invention during the fabrication step represented by FIG. 21.
Figure 21B:
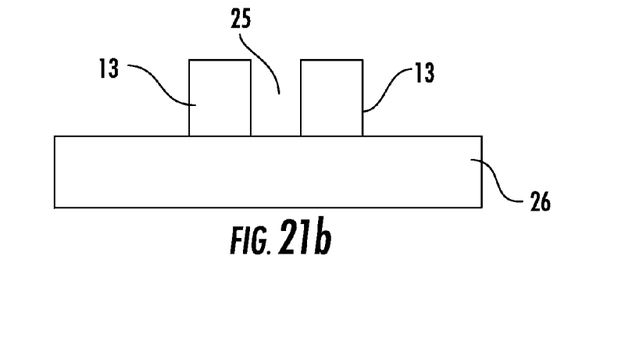
Figure 21C:
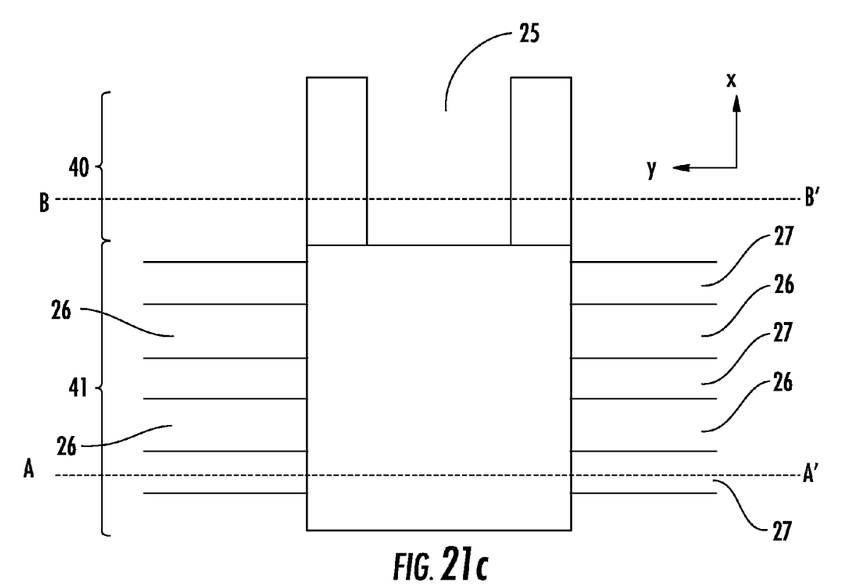
FIG. 21c is a top-view of the electrically programmable memory part including memory cells according to one embodiment of the invention during the fabrication step represented by FIG. 21.

FIGS. 21 and 21a to 21c illustrate a structure formed at the start of a method for fabricating a memory of EEPROM type according to one embodiment of the invention, which includes a first polysilicon layer 13 deposited on a substrate 11 and etched so as to exhibit a notch 25 in the places where gate contact pickups are situated, as will be detailed subsequently. This U-shaped structure of the first layer 13 is oriented in a longitudinal direction x and delimits a first zone 40 comprising the branches of the U around the notch 25 and a second zone 41 comprising the base of the U, as represented in FIG. 21c. The structure of the first zone 40 is particularly visible in FIG. 21b in transverse section.

The structure of the second zone 41 moreover includes isolation zones 26, for example employing shallow trenches, also known as STI for "Shallow Trench Isolation", produced within the substrate 11 in a transverse direction y so as to mutually isolate the future cells which will be created and aligned in the x direction in so-called "active" zones 27 disposed between these isolation zones 26, as is more particularly illustrated in the view from above of FIG. 21c. Moreover, an insulating layer 12 such as a gate oxide for example will have been created on the active zones, before the deposition and the etching of the polycrystalline silicon 13, and separates this substrate 11 from the first polysilicon layer 13. The structure thus obtained on a transverse portion at the level of an active zone 27 between isolation zones 26 of the second zone 41, visible in the section of FIG. 21a, thus corresponds to that represented by FIG. 14 described previously.

Figure 22A:
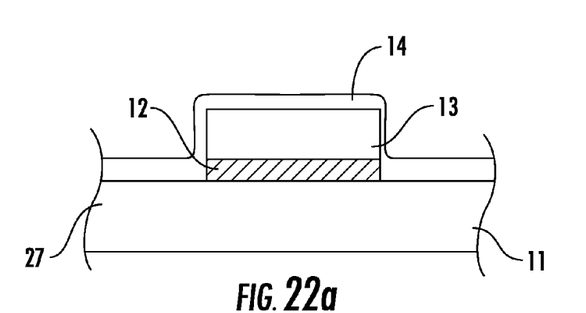
Figure 22B:
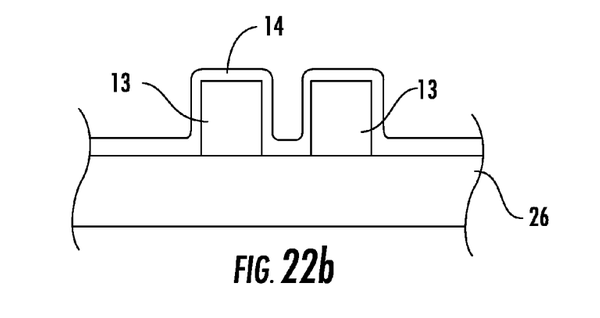
Figure 23A:
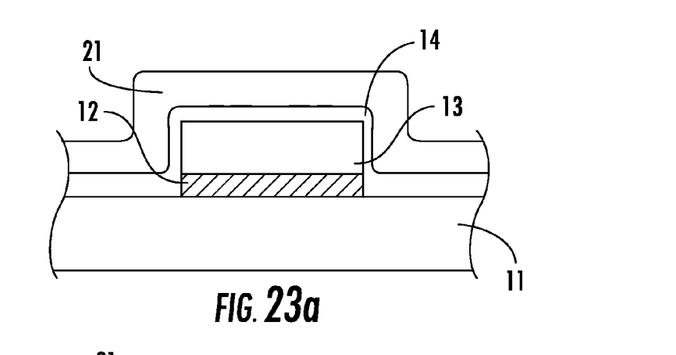
Figure 23B:
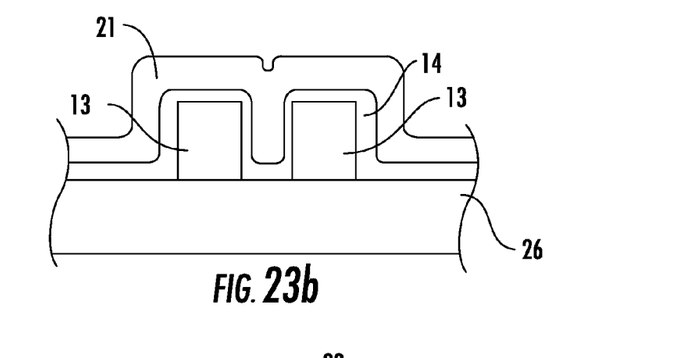
Figure 24A:
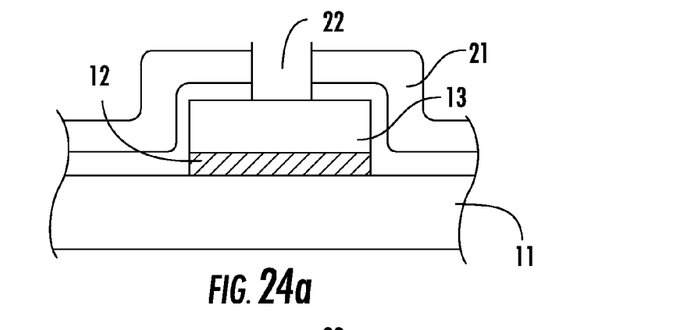
Figure 24B:
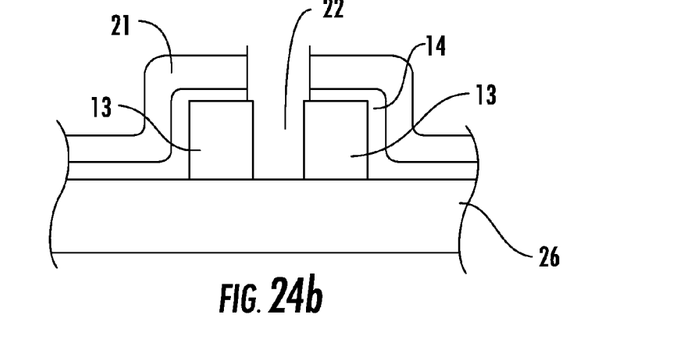

FIGS. 22a and 22b represent the result obtained after deposition of a dielectric layer 14 containing the charge trapping layer over the whole surface of this assembly. The assembly is thereafter covered with a second polysilicon conducting layer 21, as represented in FIGS. 23a and 23b. Thereafter, a first etching step generates a first central trench 22 which extends over the whole length of the structure, in the x direction, by removing the second polysilicon conducting layer 21 and the layer of ONO 14, the result of which is illustrated by FIGS. 24a and 24b. This trench 22 will define the space where the drain contacts will be disposed.

Figure 25A:
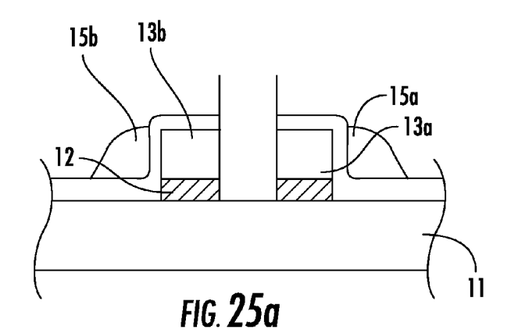
Figure 25B:
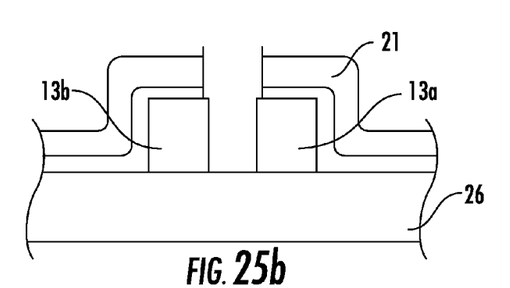

A second step of etching the second conducting layer 21, notably at the level of the second zone 41 of the structure, makes it possible to produce a second central trench 23 over the whole length of the structure, as well as the formation of the two conducting lateral parts 15a, 15b in the form of spacers, to achieve a structure, represented in FIG. 25a, similar to that represented by FIG. 17 and described previously. This second etching step preserves a significant part of the second conducting layer 21 at the level of the first zone 40, notably at the level of the section B-B' visible in FIG. 25b, so as to form future electrodes for managing the memory cells, as will be explained subsequently.

Figure 20:
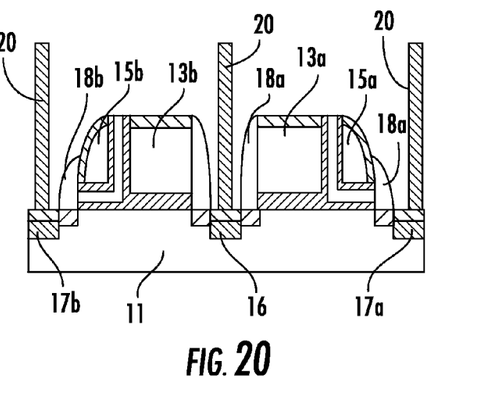
Figure 26A:
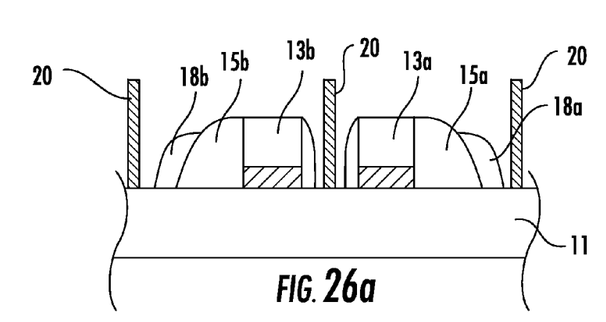
Figure 26B:
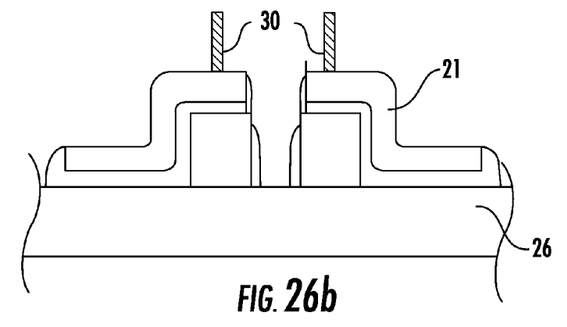
Figure 26C:
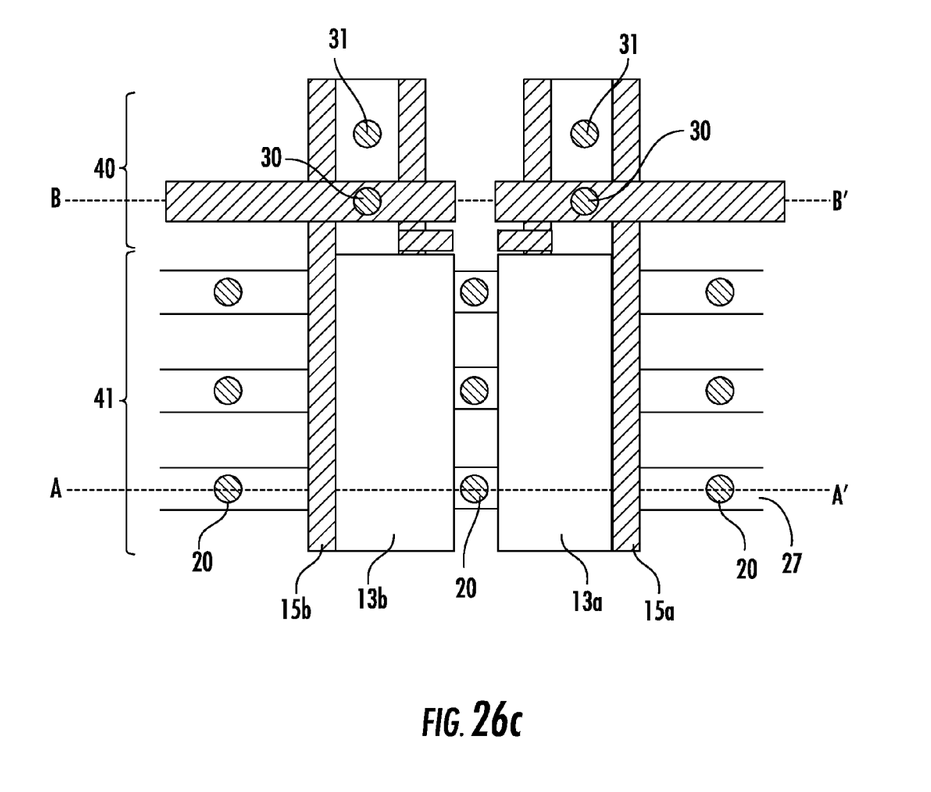
FIG. 26c is a top-view of the electrically programmable memory part including memory cells according to one embodiment of the invention.

Thereafter, a step of producing spacers 18a, 18b, of producing salicide and then of producing the contacts 20 makes it possible to obtain the finalized memory part, represented in FIG. 26a, similar to the structure of FIG. 20. Three series of two twin cells, oriented towards the front of the structure on the second zone 41 and aligned in the x direction, are represented in FIG. 26c by way of example. The twin cells share a drain electrode in the central part and possess source electrodes on their opposite sides. As a variant, these source and drain electrodes could be inverted. Naturally, this method makes it possible to fabricate a multitude of memory cells, the entirety of the memory cells of the electronically programmable memory.

The structure obtained in the second zone 41 does indeed correspond to the method and to the cells described with reference to FIGS. 13 to 20. Indeed, a transverse section gives a result similar to that represented by FIG. 20, the memory cells are therefore indeed fabricated according to the concept explained previously.

At the level of the first zone 40, gate control electrodes 30 are arranged on the second polysilicon layer 21, at the level of the section B-B'. This layer is electrically linked with the lateral parts 15a, 15b in the form of spacers of the second zone 41, and therefore with transistors for selecting the cells of one and the same row, or octet, as represented in FIG. 2. Moreover, selection electrodes 31 electrically link the various polysilicon zones 13a, 13b of the various storage transistors. This approach thus easily makes it possible to produce the various electrical links between the cells of the EEPROM memory. The first zone 40 of the structure is therefore dedicated to the management of the memory cells which are formed in the second zone 41.

The materials cited previously were mentioned by way of examples, and it is possible to reproduce the approach described previously with other materials, and by adapting the fabrication steps to these other materials.

Moreover, the method which has been described hereinabove has been applied to an EEPROM memory but it could be used for any other electrically programmable non-volatile memory, or for any semiconducting component comprising transistors, notably dual-gate transistors.

That which is claimed:

1. A method for fabricating an electrically programmable non-volatile memory type semiconductor component, the method comprising a production of a plurality of memory cells by at least:

providing an insulating oxide layer on a substrate;

positioning a first conductive polysilicon layer above the insulating oxide layer to define a U-shape notch orientated in a first direction to define a first zone and a second zone to manage and form the plurality of memory cells, respectively; and producing at least one trench within the first conductive polysilicon layer to form two electrically unlinked distinct conductive parts configured to define two transistor gates of respectively two distinct memory cells.

2. The method according to claim 1, wherein the substrate includes isolation zones oriented in a second direction transverse to the first direction to electrically insulate the memory cells.

3. The method according to claim 1, further comprising:
depositing a layer of material for trapping charges on the first and second zones;
depositing a second conductive layer above the layer of material for trapping charges; and
etching the second conductive layer at a level of the second zone to form lateral conductive polysilicon parts defining spacers separated from the first conductive polysilicon layer by a substantially vertical insulating part of the layer of material for trapping charges;
the lateral conductive polysilicon parts remaining in contact with the second conductive layer at a level of the first zone to form at least one gate control electrode of the memory cells of the second zone;
the first conductive polysilicon layer remaining accessible at the level of the first zone to form at least one electrode for selecting the memory cells of the second zone.

4. The method according to claim 3, wherein the electrically programmable non-volatile memory type semi-conductor component defines a non-volatile EEPROM.

5. The method according to claim 1, further comprising depositing a layer of material for trapping charges on the first and second zones.

6. The method according to claim 5, further comprising depositing a second conductive layer above the layer of material for trapping charges.

7. The method according to claim 6, further comprising etching the second conductive layer at a level of the second zone to form lateral conductive polysilicon parts defining spacers separated from the first conductive polysilicon layer by a substantially vertical insulating part of the layer of material for trapping charges.

8. The method according to claim 7, wherein the lateral conductive polysilicon parts remaining in contact with the second conductive layer at a level of the first zone to form at least one gate control electrode of memory cells of the second zone.

9. The method according to claim 8, wherein the first conductive polysilicon layer remaining accessible at the level of the first zone to form at least one electrode for selecting memory cells of the second zone.

* * * * *